United States Patent
Bang et al.

(10) Patent No.: US 7,675,372 B2
(45) Date of Patent: Mar. 9, 2010

(54) CIRCUIT SIMULATOR PARAMETER EXTRACTION USING A CONFIGURABLE RING OSCILLATOR

(75) Inventors: David Bang, La Jolla, CA (US); Jayakannan Jayapalan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 145 days.

(21) Appl. No.: 11/690,300

(22) Filed: Mar. 23, 2007

(65) Prior Publication Data

US 2008/0048790 A1 Feb. 28, 2008

Related U.S. Application Data

(60) Provisional application No. 60/836,787, filed on Aug. 9, 2006.

(51) Int. Cl.
*H03B 27/00* (2006.01)
(52) U.S. Cl. .......................................... 331/57; 331/44
(58) Field of Classification Search ................... 331/57, 331/44
See application file for complete search history.

(56) References Cited

U.S. PATENT DOCUMENTS

| | | | |
|---|---|---|---|
| 5,761,082 A | | 6/1998 | Miura-Mattausch |
| 5,790,436 A | * | 8/1998 | Chen et al. .................... 716/5 |
| 6,466,520 B1 | * | 10/2002 | Speyer et al. ............... 368/118 |
| 6,493,851 B1 | | 12/2002 | Bach et al. |
| 6,759,863 B2 | | 7/2004 | Moore |

FOREIGN PATENT DOCUMENTS

GB 2361077 10/2001

OTHER PUBLICATIONS

Razavi, Behzad, "CMOS Technology Characterization for Analog and RF Design". IEEE vol. 34. No. 3. Mar. 1999. pp. 268-276.
The MOSIS Service, "MOSIS Process Monitor". www.mosis.org/technical/process-monitor.html. Marina del RE, CA. Jan. 2002. pp. 1-24.
International Search Report—PCT/US07/075144, International Search Authority—European Patent Office—Jan. 11, 2008.
Nishimura. K. et al.: "Gate delay time evaluation structure for deep-submicron CMOS LSIs" IEEE Int Conf Microelectron Test Struct; IEEE International Conference on Microelectronic Test Structures, vol. 9, Mar. 1996, pp. 135-138, XP002462146.

* cited by examiner

*Primary Examiner*—Joseph Chang
(74) *Attorney, Agent, or Firm*—Jiayu Xu

(57) ABSTRACT

A configurable ring oscillator is operated in a first configuration so that an oscillating signal passes from a first node to a second node through a first signal path. A first measurement of an operational characteristic is made. The ring oscillator is operated in a second configuration where an oscillating signal passes from the first node to the second node through a second signal path. A second measurement is made. The first and second measurements are used to determine a circuit simulator parameter. If the first path has little interconnect and the second path has substantial interconnect, then the effect on circuit operation due to interconnect loading can be isolated from the effects on circuit operation due to variations in transistor performance. If the first and second paths are laid out to be identical, then the first and second measurements are usable to determine a circuit simulator mismatch parameter.

17 Claims, 2 Drawing Sheets

CIRCUIT SIMULATOR PARAMETER EXTRACTION METHOD

CIRCUIT SIMULATOR PARAMETER EXTRACTION METHOD

CONFIGURABLE RING OSCILLATOR

CIRCUIT SIMULATOR PARAMETER EXTRACTION USING A CONFIGURABLE RING OSCILLATOR

CROSS-REFERENCE TO RELATED APPLICATION

This application claims the benefit under 35 U.S.C. §119 of Provisional Application Ser. No. 60/836,787, filed Aug. 9, 2006, said provisional application is incorporated herein by reference.

BACKGROUND INFORMATION

1. Technical Field

The disclosed embodiments relate primarily to the extraction of circuit simulator parameters and/or design rules from test structures, and more particularly from ring oscillator test structures.

2. Background Information

Circuit simulation tools are commonly used in the design of integrated circuits. One commonly used circuit simulator is a program called SPICE (Simulation Program with Integrated Circuit Emphasis). A designer of a circuit to be realized in integrated circuit form describes the circuit as a netlist. The netlist defines an interconnected set of circuit components. Some examples of circuit components are basic circuit elements such as resistors, capacitors, inductors, voltage sources, and current sources. Operation of these circuit elements are usually a function of one or a small number of parameters. For example, a basic resistor is defined by a single parameter, a resistance. The netlist typically, however, includes more complex circuit components such as lengths of metal interconnect, an N-channel field effect transistor and a P-channel field effect transistor. Operation of a more complex circuit component is typically defined by a "model" involving one or more equations. The model defines operation of the circuit component as a function of multiple parameters. For example, a model of a length of interconnect may use parameters such as the running length of the interconnect, the cross-sectional width of the interconnect, the cross-sectional thickness, the distances between the interconnect and other structures, and the dielectric constants of other materials surrounding the interconnect, and other physical dimensions and electrical properties. There are many different ways of modeling circuit components. Some models are complex, whereas other models are relatively simple.

In the design a particular circuit to be realized in integrated circuit form, the models and the parameters the models use are carefully selected such that simulation of a circuit being designed will closely match actual operation of the circuit if the circuit were to be realized in integrated circuit form. After the circuit being designed has been described as a netlist, the SPICE program simulates the described circuit to determine its simulated operation. If the circuit as simulated does not work correctly, then the circuit design is changed. In this way, a circuit design is simulated and its proper operation is confirmed before the circuit is fabricated.

The values of the parameters are typically determined in a process sometimes referred to as "parameter extraction." In one example of parameter extraction, a suite of test structures is fabricated on a test die using the semiconductor manufacturing process that will later be used to fabricate the circuit to be designed. The test structures are then tested. The test structures are simulated using SPICE, and the parameters of the various models are adjusted until the SPICE simulations match the test results. See, for example, U.S. Pat. Nos. 7,047,505 and 6,934,671 and 6,795,800 for examples of different parameter extraction processes.

It is common to fabricate a ring oscillator as one such a test structure, then to operate the ring oscillator, and to measure its operating frequency. Relevant SPICE circuit parameters are adjusted such that SPICE simulation of the ring oscillator outputs a simulated oscillating frequency that matches the measured oscillating frequency. Examples of parameters that might be adjusted include the length of the gates of the transistors of the ring oscillator, the width of the gates, the dielectric constant of the gate insulator of the transistors, the thickness of the gate insulator, the threshold voltage of the transistors, the mobility of carriers in the transistors, and many other parameters. See, for example, U.S. Pat. Nos. 5,790,436 and 5,825,673. Often a second ring oscillator is fabricated on the same test die such that the second ring oscillator utilizes a different type of transistor. This second ring oscillator is used to calibrate the parameters used by the model of the transistors in the second ring oscillator. Circuit operation is not only, however, affected by transistor performance. Circuit operation is also affected by the electrical characteristics of the interconnect used to connect the various active circuits together. Lengths of different types of interconnect are sometimes fabricated on the test die along with the ring oscillators. Various electrical characteristics of these lengths of interconnect are measured to extract parameters that are used in the SPICE models for interconnect. In addition, multiple ring oscillators are sometimes fabricated on the test die such that the various ring oscillators have different amounts of interconnect in the oscillating signal paths and therefore operate differently. Sometimes a single ring oscillator is tested in an unloaded condition and then is tested again in a loaded condition. See, for example, U.S. Pat. No. 6,055,829. By comparing the operation of such ring oscillators, the effect of interconnect loading on circuit performance can be isolated to some degree and can be used to change SPICE parameters used by the interconnect models. The extraction of SPICE parameters is a complicated and time-consuming multi-dimensional task involving many different interrelated parameters and different types of test structures and different types of models.

SUMMARY

In a first novel aspect, a method of extracting a circuit simulator parameter is disclosed. A configurable ring oscillator is operated in a first configuration so that an oscillating signal passes from a first node of the ring oscillator to a second node of the ring oscillator through a first signal path. A first measurement of an operational characteristic is made. The first measurement may, for example, be a frequency measurement of the oscillating signal. The ring oscillator is then operated in a second configuration where an oscillating signal passes from the first node to the second node through a second signal path. A second measurement is made. The second measurement may, for example, be a frequency measurement of the oscillating frequency. The first and second measurements are used to determine or to calibrate the circuit simulator parameter.

In a first example of the method, the first path involves little interconnect and the second path involves substantial interconnect. Because the only substantial difference between the two paths is due to different amounts of interconnect, the effect on circuit operation due to interconnect loading is isolated from the effects on circuit operation due to variations in transistor performance. The often confounding effects of transistor variations on metal loading measurements can be eliminated. In one example, a transistor-dependent circuit simulator parameter is adjusted and the ring oscillator in the first configuration is resimulated until the simulated oscillating frequency matches the first measurement. The transistor-dependent circuit parameters are then fixed, and an interconnect-dependent circuit simulator parameter is adjusted. The ring oscillator in the second configuration is resimulated and the interconnect-dependent parameter is adjusted until the simulated oscillating frequency matches the second measurement. In this example, the circuit simulator parameter that is determined (calibrated) is the interconnect-dependent circuit simulator parameter that is adjusted to make the second match.

In a second example of the method, the first and second paths are laid out to be identical and the first and second measurements are used to determine a circuit simulator mismatch parameter. In one example, a transistor-dependent circuit simulator parameter is adjusted and the ring oscillator in the first configuration is resimulated until the simulated oscillating frequency matches the first measurement. The transistor-dependent circuit parameters are then fixed. An interconnect-dependent circuit simulator parameter is adjusted and the ring oscillator in the second configuration is resimulated until the simulated oscillating frequency matches the second measurement. The degree to which the interconnect-dependent circuit parameter was adjusted is used to determine a mismatch parameter for the interconnect-dependent circuit parameter.

In a second novel aspect, a configurable ring oscillator test structure is disclosed. The configurable ring oscillator test structure may, for example, be a part of a test die used in development of a semiconductor manufacturing process. The configurable ring oscillator has a plurality of selectable signal paths between a first node of the ring oscillator and a second node of the ring oscillator. Feedback circuitry receives a signal from the second node and supplies an inverted and delayed version of the signal onto the first node so that the combination of the first node, the second node, the selectable signals paths, and the feedback circuitry forms an oscillator. When a first of the signal paths is selected and the oscillator is operating, an oscillating signal passes from the first node to the second node through the first signal path. The second signal path is substantially nonconductive. On the other hand, when a second of the signal paths is selected and the oscillator is operating, an oscillating signal passes from the first node to the second node through the second signal path. The first signal path is substantially nonconductive.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 1:
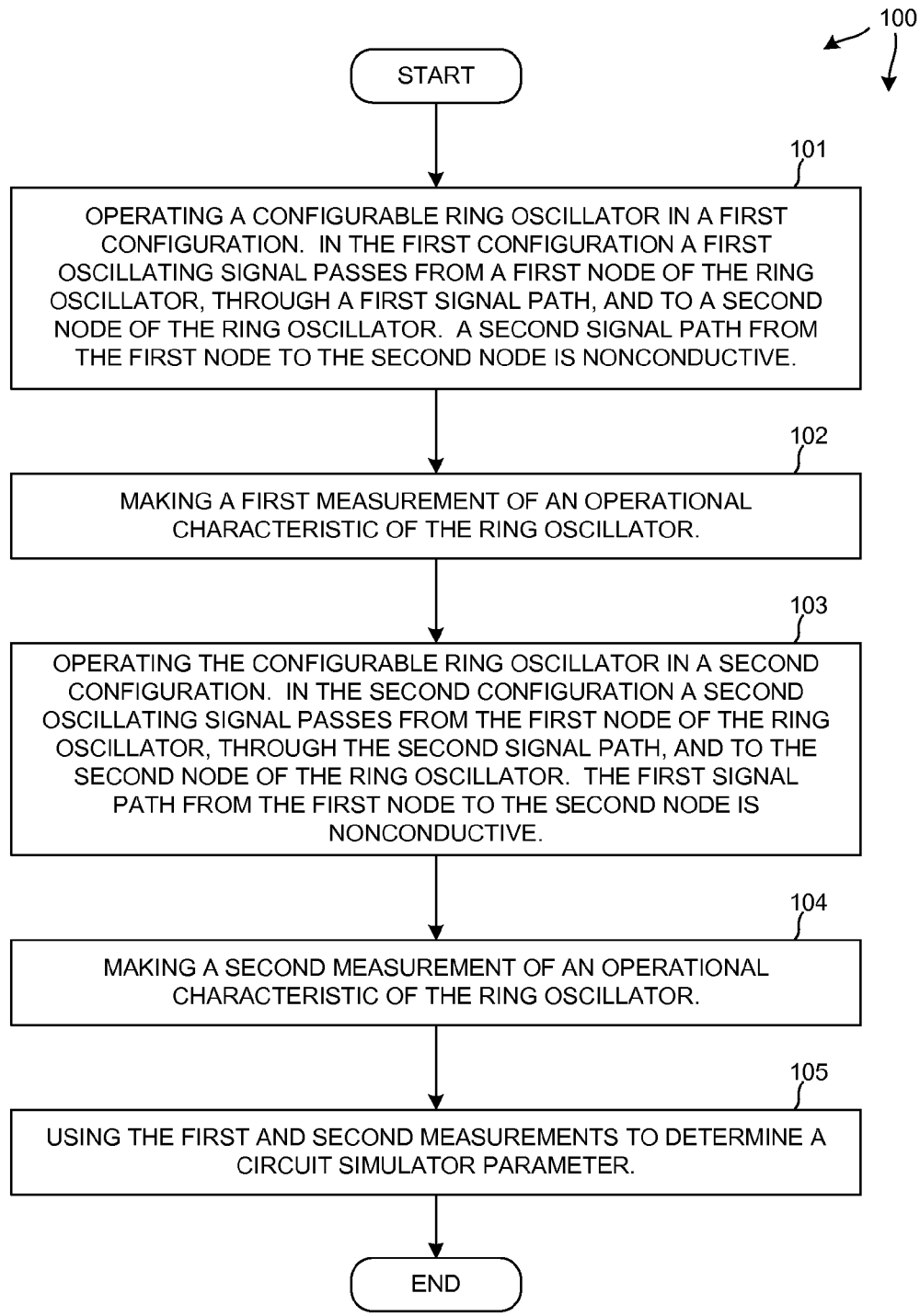
FIG. 1 is a flowchart of a parameter extraction method in accordance with a first novel aspect.

FIG. 1 is a flowchart of a parameter extraction method 100 in accordance with one novel aspect. Method 100 involves a configurable ring oscillator.

Figure 2:
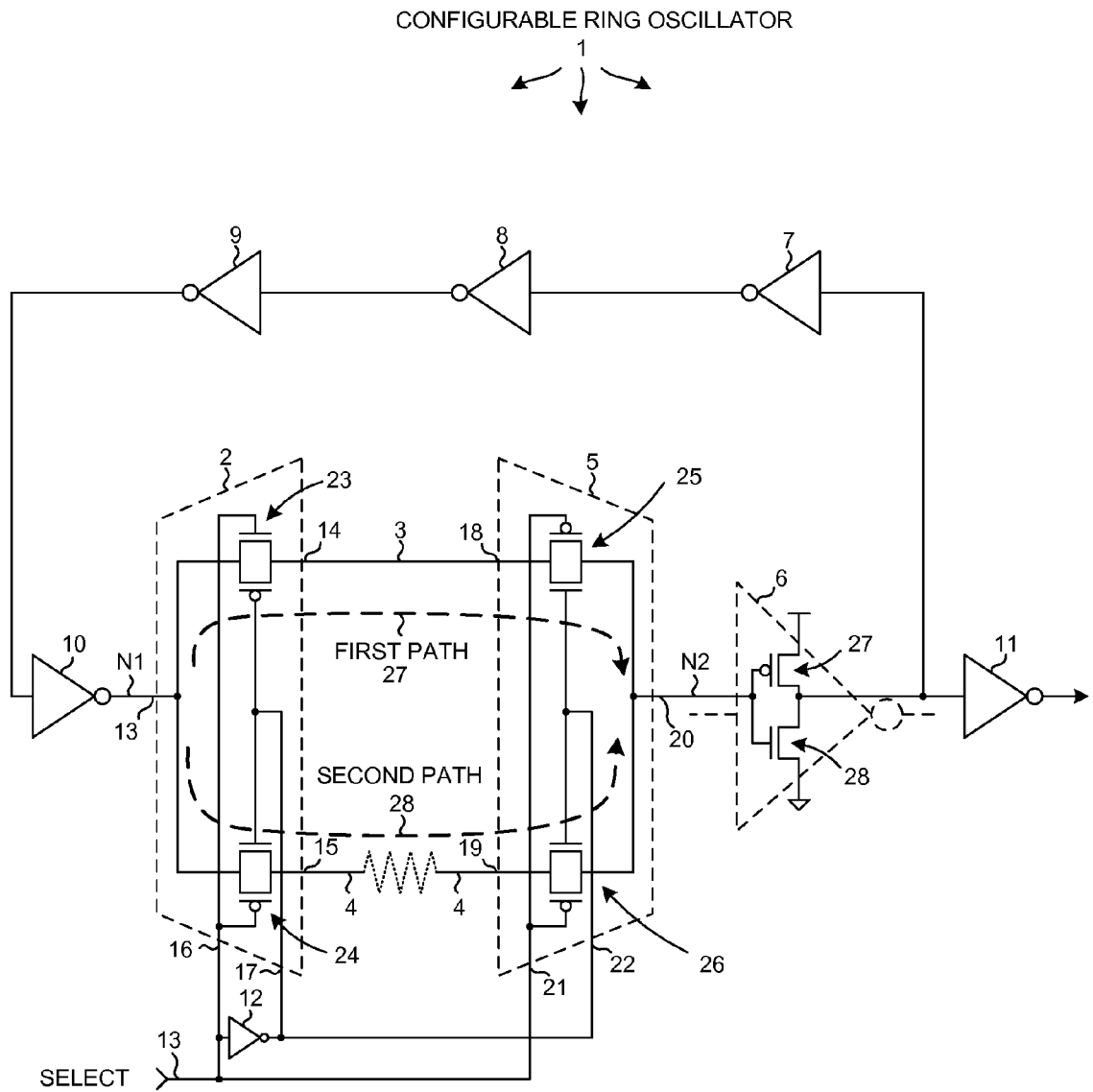
FIG. 2 is a diagram of a configurable ring oscillator test structure in accordance with a second novel aspect. The configurable ring oscillator of FIG. 2 is one example of a configurable ring oscillator that can be used in the method of FIG. 1.

FIG. 2 is a circuit diagram of one example of a configurable ring oscillator 1 usable in the method of FIG. 1. Configurable ring oscillator 1 is a dedicated test structure that is a part of an integrated circuit. More particularly, the integrated circuit is a test die used in the development of a semiconductor fabrication process. Configurable ring oscillator 1 includes a first node N1, a 1-to-2 demultiplexer 2, a first conductor 3, a second conductor 4, a 2-to-1 multiplexer 5, and a plurality of inverters 6-12. Demultiplexer 2 has a first data input lead 13, a first data output lead 14, a second data output lead 15, and control input leads 16 and 17. Multiplexer 5 has a first data input lead 18, a second data input lead 19, a data output lead 20, and control input leads 21 and 22. Inverters 6-10 are coupled in series to form a feedback circuit. The feedback circuit receives a signal from node N2 and supplies an inverted and delayed version of the signal onto node N1.

Configurable ring oscillator 1 is configurable into a selectable one of two configurations. To place configurable ring oscillator 1 into a first configuration, a digital logic high is placed on a select input lead 13 of the configurable ring oscillator. The digital logic high causes a first transmission gate 23 of demultiplexer 2 to be conductive and causes a second transmission gate 24 of demultiplexer 2 to be nonconductive. Demultiplexer 2 therefore couples first node N1 to first data output lead 14 and to first conductor 3. Second data output lead 15 and second conductor 4 are not coupled to first node N1. The digital logic high on select input lead 13 causes a first transmission gate 25 of multiplexer 5 to be conductive and causes a second transmission gate 26 of multiplexer 5 to be nonconductive. Multiplexer 5 therefore couples first conductor 3 and first data input lead 18 to second node N2. Second conductor 4 and second data input lead 19 are not coupled to second node N2. Accordingly, when the configurable ring oscillator is oscillating in the first configuration, an oscillating signal passes from first node N1, through a first signal path 27, and to second node N2. There is no gain stage in first signal path 27.

To place configurable ring oscillator 1 into a second configuration, a digital logic low is placed on select input lead 13. The digital logic low causes a first transmission gate 23 of demultiplexer 2 to be nonconductive and causes second transmission gate 24 of demultiplexer 2 to be conductive. Accordingly, demultiplexer 2 couples first node N1 to second data output lead 15 and to second conductor 4. First data output lead 14 and first conductor 3 are not coupled to first node N1. The digital logic low on select input lead 13 causes first transmission gate 25 of multiplexer 5 to be nonconductive and causes second transmission gate 26 of multiplexer 5 to be conductive. Multiplexer 5 therefore couples second conductor 4 and second data input lead 19 to second node N2. First conductor 3 and first data input lead 18 are not coupled to second node N2. Accordingly, when the configurable ring oscillator is oscillating in the second configuration, an oscillating signal passes from first node N1, through a second signal path 28, and to second node N2. There is no gain stage in second signal path 28.

In the example of FIG. 2, first conductor 3 and second conductor 4 are primarily lengths of metal conductors. Conductors 3 and 4 are substantially identical (both electrically and structurally) in every realistically possible way other than their respective lengths. The first and second metal conductors are disposed in the same metal interconnect layer of the integrated circuit and pass over and through and under the same types of materials so that the distributed resistances of conductors 3 and 4 are identical and substantially uniform, and so that the distributed capacitances of conductors 3 and 4 are identical and substantially uniform. Conductors 3 and 4 have the same type of contact structures as well.

In the example of FIG. 2, the on resistance of the transmissions gates 23-26 is approximately 101 ohms, the resistance of first conductor 3 is approximately 1k ohms, and the resistance of second conductor 4 is ten times the resistance of first conductor 3 (10k ohms). All the transmission gates 23-26 are of identical construction. The structure of demultiplexer 2, first and second conductors 3 and 4, and multiplexer 5 is such that the electrical differences between the first and second signal paths is due only to the different lengths of the first and second conductors.

Returning to the method of FIG. 1, in a first step (step 101) the configurable ring oscillator is operated in the first configuration. A first oscillating signal passes from the first node N1, through the first signal path 27, and to the second node N2. Second conductor 4 is not coupled to either node N1 or to node N2 due to transmission gates 24 and 26 being nonconductive.

In a second step (step 102), a first measurement of an operational characteristic of the configurable ring oscillator is made. Inverter 11 may, for example, output the first oscillating signal to a frequency measuring mechanism. The frequency measuring mechanism may involve a digital counter on the test die, or may involve a frequency counter that is part of external test equipment. The operational characteristic that is measured is the frequency of the first oscillating signal.

In a third step (step 103), the configurable ring oscillator is operated in the second configuration. A second oscillating signal passes from the first node N1, through the second signal path 28, and to the second node N2. First conductor 3 is not coupled to either node N1 or to node N2 due to transmission gates 23 and 25 being nonconductive.

In a fourth step (step 104), a second measurement of an operational characteristic of the configurable ring oscillator is made. As in step 102, the operational characteristic that is measured in this example is the frequency of the second oscillating signal.

In a fifth step (step 105), the first and second measurements are used to determine a circuit simulator parameter. In one example of method 100 of FIG. 1, the first and second measurements are used to calibrate a circuit simulator parameter by simulating the configurable ring oscillator in the first configuration. The configurable ring oscillator is simulated using a SPICE circuit simulator. The SPICE circuit simulator outputs a simulated frequency of the first oscillating signal. A transistor-dependent SPICE parameter is then adjusted and the configurable ring oscillator in the first configuration is resimulated, and this adjusting and resimulating process is repeated, until the simulated oscillating frequency substantially matches the frequency measured (the first measurement) on the actual configurable ring oscillator. The transistor-dependent SPICE parameter may, for example, be a gate length parameter, a gate width parameter, a gate insulator thickness parameter, or a charge carrier mobility parameter. The transistor-dependent SPICE parameters in this case relate to the P-channel field effect transistor 27 and the N-channel field effect transistor 28 of inverter 6.

At this point in the method, the transistor-dependent SPICE parameter that was previously adjusted (as well as all other transistor-dependent SPICE parameters) is fixed. The configurable oscillator is then simulated in the second configuration. An interconnect-dependent SPICE parameter is adjusted and the configurable ring oscillator is resimulated, and this adjusting and resimulating process is repeated, until the simulated oscillating frequency substantially matches the frequency measured (the second measurement) on the actual configurable ring oscillator. The interconnect-dependent SPICE parameter may, for example, be a conductor width parameter or a conductor height parameter where the conductor at issue is a metal interconnect conductor of the type of conductors 3 and 4. If, for example, the second conductor 4 is a length of metal in a "Metal 2" layer of the integrated circuit, then the interconnect-dependent SPICE parameter that is adjusted could be a width parameter that specifies the width of a Metal 2 layer conductor or could be a height parameter that specifies the height of a Metal 2 layer conductor. Rather than being a dimension, the interconnect-dependent SPICE parameter may be an electrical characteristic parameter (for example, a resistivity parameter).

In some conventional types of test dice, a series of ring oscillators is fabricated where each ring oscillator has a different amount of interconnect in the oscillating signal path. Operational differences between the different ring oscillators are attributed to the differences in the interconnect in the different ring oscillators. This conventional assumption is, however, not entirely true because the different ring oscillators have different inverter transistors. The different inverters may differ from one another in very slight ways. These differences may affect the measurements of the various ring oscillators. In method 100 of FIG. 1, on the other hand, the very same configurable ring oscillator inverters 6-10 are used in the measurements of oscillating frequency under the light interconnect loading condition of the first configuration as well as under the heavier interconnect loading condition of the second configuration. The impact of different amounts of interconnect on oscillator operation is therefore better isolated from the effects of other parts of the ring oscillator.

In a second example of method 100 of FIG. 1, the first and second measurements of steps 102 and 104 are used to determine a different type of circuit simulator parameter sometimes referred to as a "mismatch parameter". An example of a mismatch parameter is a ten percent, where the ten percent value indicates that another parameter (for example, a conductor width) can vary by plus or minus ten percent of a nominal value. Circuit simulator models may have multiple such mismatch parameters that operate on other nominal parameter values. Circuit simulators can use these mismatch parameters to perform what is sometimes called "statistical analysis". In such an analysis, the circuit simulator performs numerous simulations of a circuit, but in each different simulation the simulator changes parameters having associated mismatch parameters randomly and independently. The three sigma variant that the circuit simulator will change a given parameter by is defined by its associated mismatch parameter. Generally, the circuit being designed using the circuit simulator is to operate properly under the vast majority of cases in which one parameter varies with respect to others. If the simulation indicates that the circuit does not work properly over the various permutations of mismatch parameter values, then a problem with the circuit may have been identified.

In the second example of the method of FIG. 1, the first conductor 3 and the second conductor 4 are designed and fabricated to be as identical as possible. The two conductors 3 and 4 are laid out to have the same identical length and cross-sectional structure. They are laid out to pass over and through and under the same types of materials on the integrated circuit. The two conductors 3 and 4 may both be made to be relatively long conductors so that the resistance of the conductors is large compared to the on resistances of the transmission gates. As set forth in FIG. 1, the configurable ring oscillator is simulated in each of the first and second configurations, and a measurement of an operational characteristic (for example, the oscillating frequency) is made for each configuration. The difference between these two measurements is attributed to the electrical differences between the two paths 27 and 28, because the remainder of the configurable ring oscillator circuitry is the same. The configurable ring oscillator is therefore usable to measure the mismatch between two metal conductor paths. In the second example of the method of FIG. 1, the interconnect-dependent parameter had a first value when the simulation result of the first configuration matched the first measurement, but the interconnect-dependent parameter had a second value when the simulation result of the second configuration matched the second measurement. The degree to which the interconnect-parameter had to be adjusted to achieve the second match is used to determine the mismatch parameter. In one example, if the two values of the interconnect-parameter differed by ten percent, then the mismatch parameter for the interconnect-parameter is determined to be ten percent.

In another embodiment, the amount of measured mismatch between the two paths 27 and 28 is used to determine a design rule for the placement of flip-flops in an integrated circuit design. A flip-flip has setup and hold timing requirements that define the permissible relative timing between a signal received on a data input lead of the flip-flop and a clock signal received onto a clock input lead of the flip-flop. Multiple flip-flops may be synchronously clocked by the same clock signal, where the data output of the first flip-flop passes through an amount of logic and is then supplied onto the data input lead of the second flip-flop. As the distance between two such flip-flops increases, the variation in clock signal timing with respect to the data input signal at the second flip-flop increases. If this variation in clock signal timing is too great, the clock signal may actually arrive at the second flip-flip so early or so late that the setup or hold time requirements of the second flip-flop are violated. The length of the clock signal conductors between flip-flops should therefore be limited such that the variation in clock signal timing is reduced. The second example of the method of FIG. 1 is usable to determine the relationship between the magnitude of this timing variation and the length of the conductor carrying such a clock signal. The maximum amount of clock signal variation that is tolerable is determined based on flip-flop setup and hold times and other circuitry that supplies signals onto the data input leads of flip-flops. Next, the conductor length that results in the timing differences between the first and second signal paths being at or below the tolerable amount of signal variation is determined from the configurable ring oscillator of FIG. 2. The design rule for the maximum distance between flip-flops is set to be this conductor length.

The first and second examples of the method of FIG. 1 are just examples of how the novel configurable ring oscillator of FIG. 2 can be used to determine or to calibrate a circuit simulator parameter. There are many other examples of the method of FIG. 1. For example, multiple transistor-dependent parameters may be adjusted so that simulation results substantially match the first measurement, and then multiple interconnect-dependent parameters may be adjusted so that simulation results substantially match the second measurement.

In a third specific example of method 100 of FIG. 1, both a frequency measurement and a current consumption measurement are made on the configurable ring oscillator operating in the first configuration. A first transistor-dependent parameter (for example, a gate length parameter) is adjusted and the ring oscillator is resimulated until the simulated oscillating frequency matches the measured oscillating frequency. A second transistor-dependent parameter (for example, transistor gate width) is then adjusted and the circuit is resimulated until the simulated current consumption matches the measured current consumption. If the adjustment of the gate width parameter changed the simulated oscillating frequency, then a third transistor-dependent parameter (for example, transistor carrier mobility) can be adjusted until the simulated oscillating frequency again matches the measured frequency. Due to the interrelatedness of various transistor-dependent parameters, there may be multiple sets of parameter values that result in a similar degree of matching of the frequency and current consumption measurements to simulated frequency and current consumption values. Any way at arriving at one of the sets of parameter values can be used. The matching of simulated to measured operational characteristics does not have to be exact, but rather can be deemed to be adequate if the simulated and measured values are suitably close to one another within a predetermined range. Note that in the third specific example of the method of FIG. 1, a plurality of transistor-dependent parameters is adjusted to achieve a match to the first measurement (the first measurement is made in step 102).

After the second measurement is made in step 104, the configurable ring oscillator is simulated in the second configuration. A first interconnect-dependent parameter (for example, conductor width W) is adjusted in an attempt to match simulated oscillating frequency to measured oscillating frequency. The first interconnect-dependent parameter is not, however, adjusted so far that it moves outside a predetermined bounded range. In one example, a technique known as "scatterometry" is used to measure the width of conductors in the same layer of metal as conductors 3 and 4. The result of the scatterometry measurement is a determination that the widths of conductors 3 and 4 vary from a nominal value by plus or minus a determined percentage. This percentage defines the bounds of the bounded range of the first interconnect-dependent parameter in the example above where the first interconnect-dependent parameter is a conductor width W. If the conductor width parameter is adjusted in an attempt to match simulated oscillating frequency to measured oscillating frequency so far that the conductor width W reaches a bound of the range, then the conductor width parameter is set at the boundary value and a second interconnect-dependent parameter (for example, conductor height H) is adjusted until matching occurs. Note that in the third specific example of the method of FIG. 1, a plurality of interconnect-dependent parameters are adjusted to achieve a match to the second measurement (the second measurement is made in step 104). Any one of the plurality of interconnect-dependent parameters that is adjusted can be the circuit simulator parameter referred to in step 105 of the flowchart of FIG. 1.

Although certain specific embodiments are described above for instructional purposes, the teachings of this patent document have general applicability and are not limited to the specific embodiments described above. Rather than using single-ended circuitry in a configurable ring oscillator, circuitry that receives and outputs differential signals can be employed. Although a configurable ring oscillator is described that has only two different selectable signal paths, a configurable ring oscillator can have three or more different selectable signal paths. Two different signal paths can have passive structures that differ from one another only in a known dimension so that the effects of changing the dimension on circuit performance can be measured using the configurable ring oscillator and related methods. The two different signal paths can be made to differ from each other in capacitance such that the circuit simulator parameter that is calibrated is a dielectric constant parameter or a spacing between conductors. Demultiplexer and multiplexer structures made of logic gates rather than transmission gates can be used. Rather than fashioning the demultiplexer and multiplexer structures using transmission gates, simple pass gates (for example, N-channel transistors) can be used in the demultiplexer and multiplexer structures to couple the first and second nodes to the first and second conductors. Where the first and second measurements are frequency measurements, the first and second measurements can alternatively be measurements of time. Accordingly, various modifications, adaptations, and combinations of the various features of the described specific embodiments can be practiced without departing from the scope of the claims that are set forth below.

What is claimed is:

1. A method comprising:
   (a) operating a configurable ring oscillator in a first configuration, wherein the ring oscillator is configurable to have a selectable one of a plurality of signal paths between a first node of the ring oscillator and a second node of the ring oscillator, wherein in the first configuration a first oscillating signal passes from the first node through a first of the signal paths and to the second node;
   (b) making a first measurement of an operational characteristic of the ring oscillator configured in the first configuration;
   (c) operating the configurable ring oscillator in a second configuration, wherein in the second configuration a second oscillating signal passes from the first node through a second of the signal paths and to the second node;
   (d) making a second measurement of the operational characteristic of the ring oscillator configured in the second configuration;
   (e) using the first and second measurements to determine a circuit simulator parameter and designing a circuit with a circuit simulation tool configured with the circuit simulator parameter.

2. The method of claim 1, wherein the configurable ring oscillator comprises a first conductor having a first resistance between the first node and the second node when the configurable ring oscillator is in the first configuration in the step (b), wherein the configurable ring oscillator comprises a second conductor having a second resistance between the first node and the second node when the configurable ring oscillator is in the second configuration in the step (d), and wherein the second resistance is at least twice the first resistance.

3. The method of claim 2, wherein the circuit simulator parameter is taken from the group consisting of: a dimension of a metal conductor, a distributed resistance parameter, and a resistivity parameter.

4. The method of claim 1, wherein there is a first capacitance between the first node and the second node when the configurable ring oscillator is in the first configuration in the step (b), wherein there is a second capacitance between the first node and the second node when the configurable ring oscillator is in the second configuration in the step (d), and wherein the second capacitance is at least twice the first capacitance.

5. The method of claim 4, wherein the circuit simulator parameter is taken from the group consisting of: a dimension of a metal conductor, a spacing between metal conductors, a distributed capacitance parameter, and a dielectric constant parameter.

6. The method of claim 1, wherein the configurable ring oscillator comprises a first conductor having a first resistance between the first node and the second node when the configurable ring oscillator is in the first configuration in the step (b), wherein the configurable ring oscillator comprises a first conductor having a second resistance between the first node and the second node when the configurable ring oscillator is in the second configuration in the step (d), and wherein the second resistance and the first resistance are substantially identical.

7. The method of claim 6, wherein the circuit simulator parameter is a mismatch parameter.

8. The method of claim 1, wherein the using of (e) comprises:
   adjusting a value of a transistor-dependent parameter and simulating the configurable ring oscillator in the first configuration using the adjusted value of the transistor-dependent parameter and thereby obtaining a first simulation result, wherein the first simulation result substantially matches the first measurement; and
   adjusting a value of an interconnect-dependent parameter and simulating the configurable ring oscillator in the second configuration using the adjusted value of the interconnect-dependent parameter and the adjusted value of the transistor-dependent parameter and thereby obtaining a second simulation result, wherein the second simulation result substantially matches the second measurement.

9. The method of claim 1, wherein the using of (e) comprises:
   adjusting a plurality of transistor-dependent parameter values and simulating the configurable ring oscillator in the first configuration on a circuit simulator using the adjusted transistor-dependent parameter values and thereby obtaining a first simulation result, wherein the first simulation result substantially matches the first measurement; and
   adjusting a plurality of interconnect-dependent parameter values and simulating the configurable ring oscillator in the second configuration on the circuit simulator using the adjusted interconnect-dependent parameter values and thereby obtaining a second simulation result, wherein the second simulation result substantially matches the second measurement.

10. The method of claim 1, further comprising:
   (f) making a third measurement of the operational characteristic of the ring oscillator in the first configuration; and
   (g) adjusting a value of a second transistor-dependent parameter and simulating the configurable ring oscillator in the first configuration on a circuit simulator using the adjusted value of the transistor-dependent parameter and thereby obtaining a simulation result, wherein the simulation result substantially matches the third measurement, and wherein (f) and (g) are performed before (c) and (d).

11. The method of claim 1, wherein the first oscillating signal passes through no gain stage as it passes from the first node through the first signal path and to the second node, and wherein the second oscillating signal passes through no gain stage as it passes from the first node through the second signal path and to the second node.

12. The method of claim 1, wherein the configurable ring oscillator is a dedicated test structure, wherein the configurable ring oscillator is part of an integrated circuit, and wherein the circuit simulator parameter is a SPICE parameter, the method further comprising realizing the circuit.

13. A method comprising:
(a) operating a configurable ring oscillator in a first configuration, wherein the ring oscillator is configurable to have a selectable one of a plurality of signal paths between a first node of the ring oscillator and a second node of the ring oscillator, wherein in the first configuration a first oscillating signal passes from the first node through a first of the signal paths and to the second node;
(b) making a frequency measurement of the first oscillating signal when the configurable ring oscillator is operating in the first configuration;
(c) making a power consumption measurement when the configurable ring oscillator is operating in the first configuration;
(d) adjusting a first circuit simulator parameter and a second circuit simulator parameter such that a simulated frequency of the configurable ring oscillator in the first configuration substantially matches the frequency measured in the step (b) and such that a simulated power consumption of the ring oscillator in the first configuration substantially matches the power consumption measured in the step (c);
(e) operating the configurable ring oscillator in a second configuration, wherein in the second configuration a second oscillating signal passes from the first node through a second of the signal paths and to the second node;
(f) making a frequency measurement of the second oscillating signal when the configurable ring oscillator is operating in the second configuration; and
(g) adjusting one or more additional circuit simulator parameters such that a simulated frequency of the configurable ring oscillator in the second configuration substantially matches the frequency measured in the step (f);
(h) designing a circuit with a circuit simulation tool configured with the adjusted first circuit simulator parameter, adjusted second circuit simulator parameter, and adjusted one or more additional circuit simulator parameters; and
(i) realizing the circuit.

14. A method comprising:
(a) operating a configurable ring oscillator in a first configuration, wherein the ring oscillator is configurable to have a selectable one of a plurality of signal paths between a first node of the ring oscillator and a second node of the ring oscillator, wherein in the first configuration a first oscillating signal passes from the first node through a first of the signal paths and to the second node;
(b) making a first frequency measurement of the oscillating signal when the configurable ring oscillator is operating in the first configuration;
(c) operating the configurable ring oscillator in a second configuration, wherein in the second configuration a second oscillating signal passes from the first node through a second of the signal paths and to the second node;
(d) making a second frequency measurement of the oscillating signal when the configurable ring oscillator is operating in the second configuration;
(e) determining a circuit simulator mismatch parameter based at least in part on the first and second measurements;
(f) designing a circuit with a circuit simulation tool using the mismatch parameter; and
(g) realizing the circuit.

15. A method comprising:
step for using a configurable ring oscillator to determine a circuit simulator parameter, wherein the configurable ring oscillator is part of an integrated circuit and has a first configuration and a second configuration, wherein in the first configuration an oscillating signal passes from a first node of the ring oscillator to a second node of the ring oscillator through a first signal path and not through a second signal path, whereas in the second configuration the oscillating signal passes from the first node to the second node through the second signal path and not through the first signal path;
(h) designing an integrated circuit with a circuit simulation tool configured with the circuit simulator parameter; and
(i) realizing the circuit.

16. The method of claim 15, wherein the circuit simulator parameter is a parameter used by a SPICE model.

17. The method of claim 15, wherein the oscillating signal passes through no gain stage as it passes from the first node through the first signal path to the second node when the configurable ring oscillator is in the first configuration, and wherein the oscillating signal passes through no gain stage as it passes from the first node through the second signal path to the second node when the configurable ring oscillator is in the second configuration.

* * * * *